United States Patent [19]

Sagawa et al.

[11] 4,184,086

[45] Jan. 15, 1980

[54] SEMICONDUCTOR SWITCH

[75] Inventors: Akio Sagawa; Masayoshi Suzuki; Tetsuo Ito, all of Hitachi, Japan

[73] Assignee: Hitachi, Ltd., Japan

[21] Appl. No.: 921,951

[22] Filed: Jul. 5, 1978

[30] Foreign Application Priority Data

Jul. 13, 1977 [JP] Japan .................................. 52-82991

[51] Int. Cl.² .......................................... H03K 17/72
[52] U.S. Cl. ............................. 307/252 J; 307/252 D; 307/252 G; 307/305
[58] Field of Search .......... 307/252 R, 252 A, 252 D, 307/252 G, 252 J, 252 N, 305; 361/111

[56] References Cited

U.S. PATENT DOCUMENTS

| | | | |
|---|---|---|---|
| 3,609,413 | 9/1971 | Lane et al. | 307/305 |
| 4,015,143 | 3/1977 | Tokunaga et al. | 307/252 J |
| 4,039,865 | 8/1977 | Ohhinata et al. | 307/252 G |
| 4,063,115 | 12/1977 | Okuhara et al. | 307/252 G |

*Primary Examiner*—John Zazworsky
*Attorney, Agent, or Firm*—Craig and Antonelli

[57] ABSTRACT

A semiconductor switch comprising a PNPN switch which has a four-layered PNPN structure with at least three PN-junctions, switching means for electrically short-circuiting a path between a P-type base and an N-type emitter of the PNPN switch when a transient voltage is applied between a P-type emitter and the N-type emitter of the PNPN switch, and drive means for driving the switching means, the drive means driving the switching means so that the path between the P-type base and the N-type emitter may be electrically short-circuited for a fixed time even after termination of the transient state, whereby any improper ignition of the PNPN switch is prevented even after the termination of the transient state.

8 Claims, 6 Drawing Figures

SEMICONDUCTOR SWITCH

BACKGROUND OF THE INVENTION

1. Field of the Invention

This invention relates to a semiconductor switch which has a four-layered structure of a P-type emitter, an N-type base, a P-type base and an N-type emitter and which has at least three PN-junctions.

Hereinbelow, the semiconductor switch having the PNPN structure shall be simply termed "PNPN switch."

The PNPN switch has the disadvantage that, even in the cut-off state, the switch is improperly ignited when an abrupt forward voltage is applied between the P-type emitter (anode terminal) and the N-type emitter thereof. Such a phenomenon is called the "dv/dt effect" or "rate effect." In order to avoid the phenomenon, some proposals have heretofore been made. The withstand strength up to which the PNPN switch is not improperly ignited by a transient voltage (dv/dt) is generally termed the "dv/dt bearing capacity."

2. Description of the Prior Art

As proposals for enhancing the dv/dt bearing capacity, U.S. Pat. No. 3,609,413 and U.S. Pat. No. 4,015,143 have been known. In both the proposals, a transistor is connected between the P-type base and N-type emitter of a PNPN switch, and only when an abrupt forward voltage is applied between the P-type emitter and N-type emitter of the PNPN switch, the transistor is turned "on" to electrically short-circuit the path between the P-type base and the N-type emitter, whereby any improper ignition is prevented.

According to these methods, certainly the dv/dt bearing capacity during the period during which the abrupt transient voltage is applied is enhanced. In some cases, however, an erroneous or improper ignition occurs after termination of the transient voltage.

This phenomenon is such that, when the short-circuiting transistor turns "off" at the time of the termination of the transient voltage, the voltage between the P-type base and N-type emitter of the PNPN switch becomes higher than the activating voltage of the PNPN switch, with the result that the switch is improperly ignited.

A factor for the occurrence of the improper ignition is the recovery time constant of the PNPN switch. When the recovery time constant is great, the erroneous ignition is prone to take place.

The recovery time constant is determined by the integration structure of the PNPN switches. In general, it increases as the density of integration is raised. Accordingly, it has heretofore been limited to enhance the dv/dt bearing capacity and to simultaneously raise the density of integration.

SUMMARY OF THE INVENTION

The first object of this invention is to provide a semicondutor switch which prevents any improper ignition from occurring after termination of a transient voltage.

The second object of this invention is to provide a semiconductor switch which has a high dv/dt bearing capacity and a high density of integration.

The third object of this invention is to provide a semiconductor switch which has its cost lowered by making the density of integration high.

The first feature of this invention consists in disposing drive means for short-circuiting switching means connected between the P-type base and N-type emitter of a PNPN switch, for a fixed time even after termination of a transient voltage.

The second feature of this invention is that the drive means is constructed of an electrostatic capacitive element and a pulse width expand circuit which are disposed between the P-type emitter of the PNPN switch and a control terminal of the switching means.

The third feature of this invention is that the drive means is constructed of a PN-junction device of an inverse junction and a pulse width expand circuit which are connected in series between the N-type base of the PNPN switch and a control terminal of the switching means.

The fourth feature of this invention is that the drive means is constructed of a PNP transistor which is disposed between the N-type base of the PNPN switch and a control terminal of the switching means, and a PN-junction device of an inverse junction which is connected between the emitter and base of the PNP transistor.

DETAILED DESCRIPTION OF THE INVENTION

Figure 1:
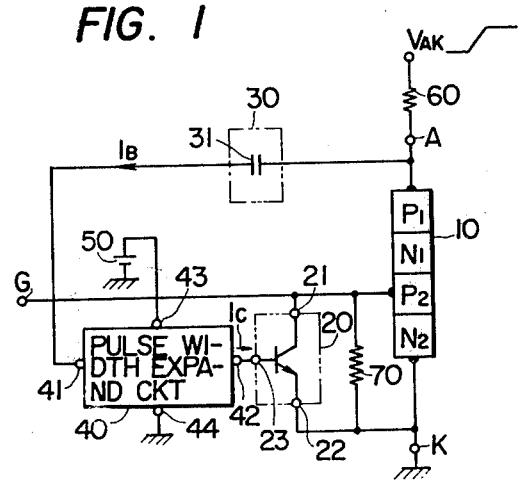
FIGS. 1, 3 and 4 are connection diagrams each showing an embodiment of this invention.

FIG. 1 shows an embodiment of this invention. Fundamentally, it is made up of a PNPN switch 10, switching means 20, an electrostatic capacitive element 30 and a pulse width expand circuit 40.

The electrostatic capacitive element 30 and the pulse width expand circuit 40 constitute drive means to be described later.

The PNPN switch 10 has a four-layered structure consisting of a P-type emitter ($P_1$), an N-type base ($N_1$), a P-type base ($P_2$) and an N-type emitter ($N_2$). The P-type emitter ($P_1$) is provided with an anode terminal A, the N-type emitter ($N_2$) is provided with a cathode terminal K, and the P-type base ($P_2$) is provided with a gate terminal G. By impressing a gate signal on the gate terminal G, the PNPN switch 10 is ignited.

The switching means 20 is concretely illustrated as an NPN transistor here. It has an input terminal 21, an output terminal 22 and a control terminal 23. The input terminal 21 is connected to the P-type base ($P_2$) of the PNPN switch 10, while the output terminal 22 is connected to the N-type emitter ($N_2$) of the PNPN switch 10.

The control terminal 23 of the switching means 20 is connected to an output terminal 42 of the pulse width expand circuit 40. By a driving signal from the pulse width expand circuit 40, the switching means 20 is operated to short-circuit the path between the P-type base ($P_2$) and N-type emitter ($N_2$) of the PNPN switch 10.

The electrostatic capacitive element 30 and the pulse width expand circuit 40 form the drive means for operating the switching means 20. The drive means detects the transient state in which the voltage between the P-type emitter (anode A) and N-type emitter (cathode K) of the PNPN switch 10 rises abruptly, and it delivers the driving signal to the control terminal 23 of the switching means 20 during a period which is longer than the period of the transient state.

Figure 2:
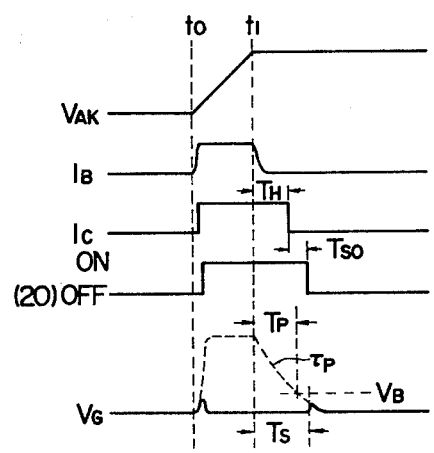
FIG. 2 is a waveform diagram for explaining the operation of the embodiment shown in FIG. 1.

Let it now be supposed that a voltage $V_{AK}$ having a ramp function which rises at a time $t_0$ and reaches a predetermined value at a time $t_1$ as indicated in FIG. 2 has been applied to the anode A of the PNPN switch 10.

In this case, the transient voltage $V_{AK}$ is differentiated by a capacitor 31, and the differential current $I_B$ is entered into the pulse width expand circuit 40.

The pulse width expand circuit 40 sustains the current $I_B$ for driving the switching means 20, for a predetermined time $T_H$ after the time $t_1$ at which the rise of the transient voltage terminates. Thus, any improper or erroneous ignition of the PNPN switch after the termination of the rise of the transient voltage is prevented.

The operation will be explained more concretely.

$T_P$ is let to denote the period of time which is taken after the time $t_1$ of the termination of the rise of the transient voltage $V_{AK}$ in order that the terminal voltage $V_G$ of the gate G at the time when the switching means 20 is not connected may lower down to the activation voltage $V_B$ of the PNPN switch (as indicated by a broken line in the figure). $T_S$ is let to denote the period of time which is taken until the switching means 20 turns "off" and then the gate G terminal voltage rises again and reaches its peak point. Heretofore, it has been the actual circumstances that when the period $T_S$ becomes shorter than the period $T_p$, a voltage equal to or greater than the activation voltage $V_B$ appears at the gate G terminal of the PNPN switch 10 even after the termination of the rise of the transient voltage, so that the switch is improperly ignited.

In contrast, in the semiconductor switch shown in FIG. 1, even in case where the period of time $T_P$ which is taken until the gate terminal voltage $V_G$ drops down to the activating voltage $V_B$ owing to the recovery time constant $\tau_P$ of the PNPN switch 10 is longer than the period of time $T_{SO}$ which is taken until the switching means 20 turns "off" after the time $t_1$ of the termination of the rise of the transient voltage (even in case where $T_P > T_S \fallingdotseq T_{SO}$), the condition of $T_P < T_S \fallingdotseq T_{SO} + T_H$ holds because the current $I_B$ for driving the switching means 20 is sustained for the predetermined period of time $T_H$ by the pulse width expand circuit 40. Therefore, even after the termination of the rise of the transient voltage, the erroneous ignition can be perfectly prevented.

A resistor 70 in FIG. 1 has heretofore been employed. It is disposed between the P-type base ($P_2$) and N-type emitter ($N_2$) of the PNPN switch 10, and its magnitude has influence on the gate sensitivity and the dv/dt bearing capacity. In general, when the resistance of the resistor 70 is made high, the gate sensitivity improves, but the dv/dt bearing capacity lowers. Conversely, when the resistance is made low, the gate sensitivity worsens, but the dv/dt bearing capacity rises.

A resistor 60 is a load of the PNPN switch 10. A battery 50 is a power source of the pulse width expand circuit 40. Terminals 41, 42, 43 and 44 are external terminals of the pulse width expand circuit 40.

Figure 3:
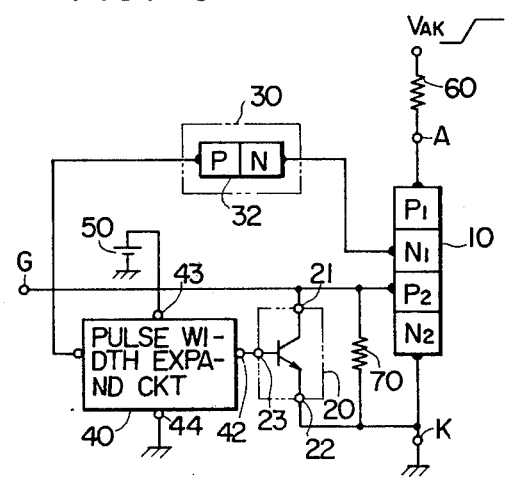

FIG. 3 shows the second embodiment of this invention. Here, the switching means 20 and the pulse width expand circuit 40 are the same as in FIG. 1. As the electrostatic capacitive element 30, a PN-inverse junction electrostatic capacity made of a diode 32 is utilized. In addition, one end of the electrostatic capacitive element 30 is connected to the N-type base ($N_1$) of the PNPN switch 10.

Also in the semiconductor switch in FIG. 3, when a transient voltage is applied to the anode A, a differential current flows from the N-type base ($N_1$) of the PNPN switch 10 through the inverse junction electrostatic capacity of the diode 32 to the pulse width expand circuit 40, and it is sustained for a predetermined time by the pulse width expand circuit 40, so that the same effect as in the embodiment of FIG. 1 can be expected.

Figure 4:
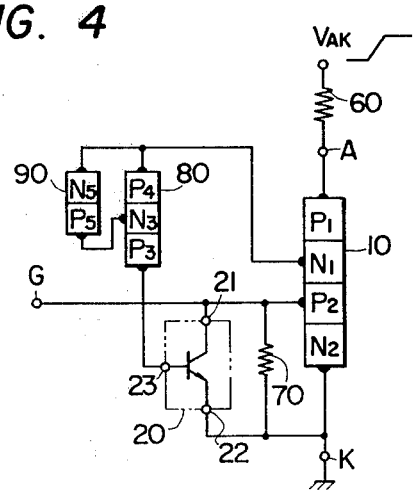

FIG. 4 shows the third embodiment of this invention. In this embodiment, a PNP transistor 80 which consists of a P-type collector ($P_3$), an N-type base ($N_3$) and a P-type emitter ($P_4$) is connected between the N-type base ($N_1$) of the PNPN switch 10 and the control terminal 23 of the switching means 20. Further, a PN-junction device 90 which consists of layers $P_5$ and $N_5$ and which has an electrostatic capacity is disposed between the base ($N_3$) and emitter ($P_4$) of the PNP transistor 80.

When FIG. 4 is compared with FIG. 1, a portion corresponding to the electrostatic capacitive element 30 in FIG. 1 is the junction electrostatic capacity of the layers $N_3$ and $P_3$ of the PNP transistor 80 in FIG. 4, and a portion corresponding to the pulse width expand circuit 40 is the PN-junction device 90.

In FIG. 1, the electrostatic capacitive element 30 and the pulse width expand circuit 40 constitute the drive means for the switching means 20. In FIG. 4, the PNP transistor 80 and the PN-junction device 90 form the drive means.

In operation, when an abrupt transient voltage is applied to the anode A of the PNPN switch 10, a current changing the junction between the base ($N_3$) and collector ($P_3$) of the transistor 80 flows to the control terminal 23 of the switching means 20 in the process of the rise of the transient voltage (during a period $t_{0-t1}$ in FIG. 2). Thus, the path between the gate G and cathode K of the PNPN switch 10 is suppressed to a low resistance, and the erroneous or improper ignition is prevented. The charging current of the base ($N_3$) - collector ($P_3$) junction at this time consists of a current which flows through the emitter ($P_4$) of the transistor 80, and a current which charges the electrostatic capacity of the layer $N_5$ - layer $P_5$ junction of the PN-junction device 90. Therefore, charges are stored in the inverse junction electrostatic capacity of the PN-junction device 90.

After completion of the rise of the transient voltage (after $t_1$ indicated in FIG. 2), the charging current based on the transient voltage is not received from the anode A. Since, however, the charges stored in the inverse junction of the PN-junction device 90 are discharged through the emitter ($P_4$) and base ($N_3$) of the transistor 80, the equivalent recovery time of the transistor 80 becomes long, and the base current of the transistor being the switching means 20 can be sustained. In this manner, when the transient voltage is applied to the PNPN switch 10, the switching means 20 can be operated, not only in the process of the rise of the transient voltage, but also for a period longer than the recovery time $T_P$ of the PNPN switch (the period of time taken until the gate voltage of the PNPN switch becomes less than the activation voltage $V_B \fallingdotseq 0.7$ V) even after the termination of the rise of the transient voltage. The path between the gate G and cathode K of the PNPN switch 10 can accordingly be short-circuited during such a period.

Figure 5:
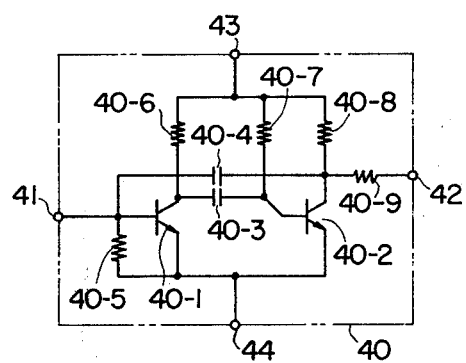
FIGS. 5 and 6 are circuit diagrams respectively showing concrete embodiments of pulse width expand circuits in FIGS. 1 and 3.

FIG. 5 shows a concrete example of the pulse width expand circuit 40 in FIG. 1 or FIG. 3. This example is a monostable multivibrator which is made up of transistors 40-1 and 40-2, capacitors 40-3 and 40-4, and resistors 40-5 to 40-9. When a current pulse (the current from the electrostatic capacitive element 30) is impressed on an input terminal 41 of the monostable multivibrator 40, a voltage of a certain pulse width determined by the time constant of the monostable multivibrator 40 is generated, and a current for driving the switching means 20 is supplied from an output terminal 42 through the resistor 40-9.

Figure 6:
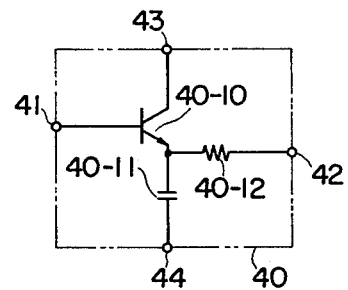

FIG. 6 shows another concrete emnbodiment of the pulse width expand circuit 40. It is made up of a transistor 40-10, a capacitor 40-11 and a resistor 40-12. When a current pulse is impressed on an input terminal 41, a supply voltage (the voltage of the battery 50 indicated in FIG. 1) applied to the collector of the transistor 40-10 is given to the capacitor 40-11. After the input current pulse has vanished, a current for driving the switching means 20 is supplied from an output terminal 42 according to the time constant between the resistor 40-12 and the capacitor 40-11. The current for driving the switching means 20 can accordingly be sustained by appropriately selecting the values of the resistor 40-12 and the capacitor 40-11.

In the foregoing embodiments of this invention, the current-driven switch of the PNPN four-layered structure is employed as the semiconductor switch. Also in case of employing a photo-driven switch, a high dv/dt bearing capacity as in the previous embodiments is attained, and a semiconductor switch having a high density of integration can be provided.

We claim:
1. A semiconductor switch comprising:
   (a) a PNPN switch which has a four-layered structure consisting of a P-type emitter, an N-type base, a P-type base and an N-type emitter and which has at least three PN-junctions,
   (b) switching means which has an input terminal, an output terminal and a control terminal,
      said input terminal and said output terminal of said switching means being respectively connected to said P-type base and said N-type emitter of said PNPN switch, a path between said P-type base and said N-type emitter of said PNPN switch being electrically short-circuited by a driving signal impressed on said control terminal, and
   (c) drive means for delivering said driving signal to said control terminal of said switching means, said drive means detecting a transient state in which a voltage between said P-type emitter and said N-type emitter of said PNPN switch rises abruptly, and delivering said driving signal to said control terminal of said switching means during a period which is longer than a period of said transient state.

2. A semiconductor switch according to claim 1, wherein said drive means is constructed of an electrostatic capacitive element and a pulse width expand circuit which are connected in series between said P-type emitter of said PNPN switch and said control terminal of said switching means.

3. A semiconductor switch according to claim 1, wherein said drive means is constructed of a PN-junction device of an inverse junction and a pulse width expand circuit which are connected in series between said N-type base of said PNPN switch and said control terminal of said switching means.

4. A semiconductor switch according to claim 1, wherein said drive means is constructed of a PNP transistor which is connected between said N-type base of said PNPN switch and said control terminal of said switching means and which has an emitter terminal and a collector terminal thereof connected to said N-type base and said control terminal respectively, and a PN-junction device which is connected with its N-layer lying on the emitter terminal side of said PNP transistor and with its P-layer lying on the base terminal side of said PNP transistor.

5. A semiconductor switch according to claim 2, wherein said pulse width expand circuit is a one-shot multivibrator which is driven by a transient current entered through said electrostatic capacitive element and which delivers a prescribed pulse width.

6. A semiconductor switch according to claim 2, wherein said pulse width expand circuit is constructed of an NPN transistor whose base terminal is connected to said electrostatic capacitive element, whose collector terminal is connected to a driving power source and whose emitter terminal is connected to a capacitor, and a resistor which is connected between said emitter terminal of said PNP transistor and said control terminal of said switching means.

7. A semiconductor switch according to claim 2, wherein said pulse width expand circuit is a one-shot multivibrator which is driven by a current entered through a PN-junction device of an inverse junction and which delivers a prescribed pulse width.

8. A semiconductor switch according to claim 3, wherein said pulse width expand circuit is constructed of an NPN transistor whose base terminal is connected to a P-layer of said PN-junction device of the inverse junction, whose collector terminal is connected to a driving power source and whose emitter terminal is connected to a capacitor, and a resistor which is connected between said emitter terminal of said NPN transistor and said control terminal of said switching means.

* * * * *